(12) United States Patent
Ishizaka

(10) Patent No.: US 8,379,300 B2
(45) Date of Patent: Feb. 19, 2013

(54) WAVELENGTH-VARIABLE LIGHT SOURCE WITH DUAL RESONATOR LOOP CIRCUIT

(75) Inventor: Masashige Ishizaka, Tokyo (JP)

(73) Assignee: NEC Corporation, Tokyo (JP)

( * ) Notice: Subject to any disclaimer, the term of this patent is extended or adjusted under 35 U.S.C. 154(b) by 431 days.

(21) Appl. No.: 12/864,057

(22) PCT Filed: Feb. 3, 2009

(86) PCT No.: PCT/JP2009/051733
§ 371 (c)(1),
(2), (4) Date: Jul. 22, 2010

(87) PCT Pub. No.: WO2009/104469
PCT Pub. Date: Aug. 27, 2009

(65) Prior Publication Data
US 2010/0296159 A1    Nov. 25, 2010

(30) Foreign Application Priority Data
Feb. 19, 2008    (JP) ................................. 2008-037285

(51) Int. Cl.
*H01S 5/00* (2006.01)
*H01S 3/082* (2006.01)

(52) U.S. Cl. ........................... 359/344; 359/349; 372/97

(58) Field of Classification Search .................. 359/344, 359/349; 372/97
See application file for complete search history.

(56) References Cited

U.S. PATENT DOCUMENTS

| | | | | |
|---|---|---|---|---|
| 5,001,523 A | * | 3/1991 | Lomashevich et al. | ....... 359/332 |
| 5,353,295 A | * | 10/1994 | Holonyak et al. | .......... 372/50.12 |
| 5,684,623 A | * | 11/1997 | King et al. | .................... 359/346 |
| 6,009,115 A | * | 12/1999 | Ho | .................... 372/92 |
| 6,389,044 B1 | * | 5/2002 | Smith | .............. 372/23 |
| 6,570,893 B1 | * | 5/2003 | Libatique et al. | ................ 372/20 |
| 6,668,006 B1 | * | 12/2003 | Margalit et al. | .................. 372/97 |
| 6,807,002 B2 | * | 10/2004 | Yoon | ............................ 359/346 |
| 6,940,878 B2 | * | 9/2005 | Orenstein et al. | ............... 372/20 |
| 7,489,439 B2 | * | 2/2009 | Kuo et al. | ..................... 359/334 |
| 7,949,029 B2 | * | 5/2011 | Sugg et al. | ................. 372/50.12 |

FOREIGN PATENT DOCUMENTS

| | | |
|---|---|---|
| JP | 62-55983 A | 3/1987 |
| JP | 10-209534 A | 8/1998 |
| JP | 2000077771 A | 3/2000 |

(Continued)

OTHER PUBLICATIONS

International Search Report for PCT/JP2009/051733 mailed Mar. 3, 2009.

(Continued)

*Primary Examiner* — Eric Bolda

(57) ABSTRACT

A wavelength-variable light source according to the present invention includes 2×2 3-dB directional coupler 3, closed loop-type optical circuit 5, at least two resonators 1 and 2, and optical amplifier 4. The closed loop-type optical circuit 5 is formed by connecting ends of the two output paths of 3-dB directional coupler 3. The resonators 1 and 2 have different resonance wavelength periods. One end of optical amplifier 4 is optically connected to one input path end 6 of 3-dB directional coupler 3. Lasing light is output from the other end of the optical amplifier 4. A non-reflecting structure is formed at the other input path end 7 of the 3-dB directional coupler. The wavelength-variable light source configured as described above includes an element configured to vary the resonance wavelength of the resonator 1 or 2.

12 Claims, 4 Drawing Sheets

FOREIGN PATENT DOCUMENTS

JP    2006245344 A    9/2006

OTHER PUBLICATIONS

J. D. Berger et al., "Widely tunable external cavity diode laser using a MEMS electrostatic rotary actuator", Proc. 27th European Conference on Optical Communication (ECOC '01), 2001: pp. 198-199.

H. Yamazaki, et al., "Widely Tunable Laser Consisting of a Silica Waveguide Double Ring Resonator Connected Directly to a Semiconductor Optical Amplifier", 30th European Conference on Optical Communication, 2004, th4.2.3.

B. Mason et al., "Widely Tunable Sampled Grating DBR Laser with Integrated Electroabsorption Modulator", IEEE Photonics technology Letters, vol. 11, No. 6, Jun. 1999, pp. 638-640.

* cited by examiner

WAVELENGTH-VARIABLE LIGHT SOURCE WITH DUAL RESONATOR LOOP CIRCUIT

The present application is the National Phase of PCT/JP2009/051733, filed Feb. 3, 2009, which claims priority based on Japanese Patent Application No. 2008-37285 filed on Feb. 19, 2008 and incorporates the entirety of the disclosure thereof.

TECHNICAL FIELD

The present invention relates to a light source used for optical communication, optical information processing, and optical interconnection, and in particular, to a laser light source with a wavelength variation function.

BACKGROUND ART

In recent years, internet traffic has been increasing rapidly. To deal with this, techniques for increasing communication capacity have been developed. One of these techniques called wavelength division multiplexing (WDM) increases the capacity by increasing the number of wavelengths.

For the WDM, active efforts have been made to increase the communication capacity excellent in flexibility, in association with development of for example, reconfigurable optical add/drop multiplexers (ROADMs) and optical cross connect (OXC) based on wavelength routing. WDM not only utilizes wavelength resources to increase communication capacity but also to actively utilize wavelength resources to improve network functions.

In an interrelated manner, the increase in communication capacity and the enhancement of functions of a communication scheme enable inexpensive, secure communication services to be provided. When such a communication system is constructed, a wavelength-variable laser light source serves as an important, key device.

In the WDM system according to the related art, a plurality of fixed wavelength light sources with wavelengths spaced at given intervals are arranged. In particular, the cost of backup light sources (the number of which is equal to the number of wavelengths) for maintenance and management is a major factor inhibiting a reduction in system costs.

Applying a wavelength-variable light source to such a WDM system allows light sources of the same type to be used in the entire system. This enables a drastic reduction in system costs. Furthermore, the wavelength-variable light source, which offers a high switching speed, is also an indispensable element for realizing new network functions for wavelength routing.

As a wavelength-variable light source that can cover a C band or an L band, the use of a movable MEMS mirror is described in Non-Patent Document 1 described below. This light source exhibits relatively favorable optical output characteristics. However, there is a concern about the practicality of this light source in terms of production costs and impact resistance.

Furthermore, Non-Parent Document 2 reports a DBR laser (Distributed Bragg Reflector laser) offering improved mode stability and further integrated with a modulator. However, the DBR laser is disadvantageous in terms of costs and reliability.

In connection with a wavelength-variable light source that uses a planar lightwave circuit (PLC) as an external resonator, several configurations have been proposed (for example, Patent Document 1 described below). Furthermore, the PLC is easy to produce and includes no movable section in contrast to MEMS. The PLC is thus excellent in production yield and reliability (particularly impact resistance) and is expected to be suitable for mass production.

Non-Patent Document 3 reports a laser configuration that uses a ring-type external resonator and a semiconductor optical amplifier. The configuration described in this document also includes a wavelength-variable light source with no movable portion but offers favorable characteristics in terms of a wavelength-variable range, an optical output, and the like. However, the thus configured wavelength-variable light source limits the FSR (Free Spectrum Range) of the ring-type external resonator, that is, the wavelength-variable range at the resonance wavelength period.

To increase the wavelength-variable range, it is necessary to reduce the bending radius of a waveguide and thus the size of the ring-type resonator. However, the reduction in the bending radius of the waveguide is limited in connection with optical loss. This is a factor limiting the wavelength-variable range.

Non-Patent Document 1: Jill D. Berger et al., "27th European Conference on Optical Communication (ECOC '01), VOL. 2, 2001, p. 198-199

Non-Patent Document 2: B. Mason et al., "IEEE Photonics Letters", Vol. 11, No. 6, June 1999, p. 638-639

Non-Patent Document 3: H. Yamazaki et al., "30th European Conference on Optical Communication", 2004, th4.2.3

Patent Document 1: JP2006-245344A

In a high-density wavelength division multiplexing (D-WDM) transmission scheme in optical communication, the communication wavelength band is divided into a C band and an L band. In each of the wavelength bands, many wavelength signal beams are introduced into a wavelength range of about 40 nm.

Development of many wavelength-variable lasers is now under way based on a wavelength-variable range of 40 nm. Almost no wavelength-variable laser has a large wavelength-variable range (at least 80 nm) such that a single light source can cover both the C band and the L band.

Furthermore, a CWDM (Coarse WDM) scheme in which signal light wavelengths are set at intervals of about 20 nm requires a wider range of wavelength variations.

DISCLOSURE OF THE INVENTION

The present invention provides a wavelength-variable light source that enables the above-described problems to be solved. An example of an object of the present invention is to provide a wavelength-variable light source that enables the wavelength-variable range to be increased in spite of a relatively simple configuration that uses a planar optical circuit including no movable section.

An aspect of the present invention is a wavelength-variable light source configured to vary a wavelength of output lasing light and includes a 3-dB directional coupler, a closed loop-type optical circuit, at least two resonators, an optical amplifier, a reflection structure, a non-reflection structure, and a resonance wavelength variation element.

The 3-dB directional coupler includes two input paths and two output paths. The closed loop-type optical circuit is formed by connecting ends of the two output paths of the 3-dB directional coupler.

The at least two resonators are cascaded together so as to form a part of the closed loop-type optical circuit. The resonators have different resonance wavelength periods.

One end of the optical amplifier is optically connected to one of the input path ends of the 3-dB directional coupler. Lasing light is output from the other end of the optical amplifier.

A reflecting structure with a predetermined reflection rate is formed at the other end of the optical amplifier. A non-reflecting structure is formed at the other input path end of the 3-dB directional coupler.

Moreover, the wavelength-variable light source configured as described above includes a resonance wavelength variation element configured to vary the resonance wavelength of at least one of the at least two resonators.

According to the present invention, the wavelength of the lasing light can be varied by varying the resonance wavelength of the resonator. In particular, the present invention can provide a wavelength-variable range that can cover a wide band.

Figure 1:
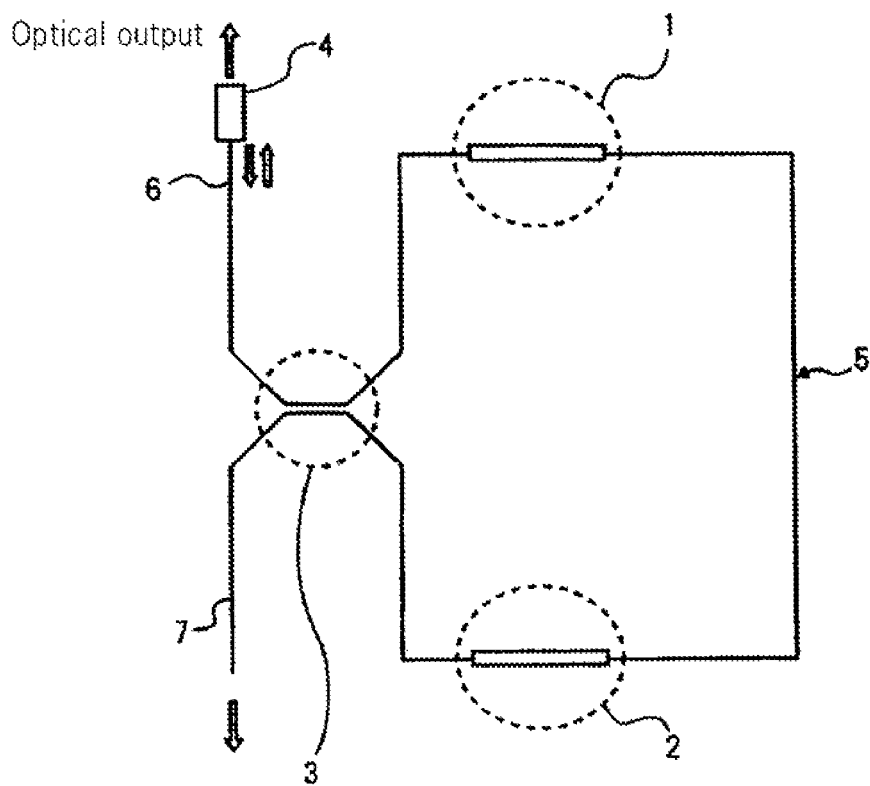
FIG. 1 is a diagram illustrating a basic configuration and a basic operation according to the present invention.

DESCRIPTION OF SYMBOLS 1, 2 Resonators
3 3-dB directional coupler
4 Semiconductor optical amplifier
11 Spectrum showing wavelength dependence of transmittance of resonator 1
12 Spectrum showing wavelength dependence of transmittance of resonator 2
13 Synthesized transmittance spectrum obtained when resonator 1 and resonator 2 are cascaded together
100 Semiconductor optical amplifier
101, 109 Output waveguides in 3-dB directional coupler
102, 104, 106 Air gap mirrors
103, 105 Waveguide etalons
107, 108 Heaters
110 3-dB directional coupler
111, 112 I/O optical waveguide
114 Waveguide end face with non-reflecting coating
115 Waveguide exit end face of semiconductor optical amplifier
201, 205, 208, 211 Si waveguide sections forming air gap mirror
202, 203, 204, 206, 207, 209, 210 Waveguide air gap sections forming air gap mirror
301 Transmittance of air gap mirrors 102, 106
302 Transmittance of air gap mirror 104
401 Wavelength interval (that is, wavelength-variable range) of peak transmittance
121 Thermal separation waveguide
601 Si waveguide core layer
602 Si taper waveguide core layer
603 $SiO_2$ clad layer
604 SiON waveguide

BEST MODE FOR CARRYING OUT THE INVENTION

An exemplary embodiment will be described below with reference to the drawings.

A basic configuration and a basic operation according to the present invention will be described before showing the exemplary embodiment.

A wavelength-variable light source according to the present invention is a laser light source capable of varying the oscillation wavelength of output laser light by electric control.

FIG. 1 is a schematic diagram showing the basic configuration according to the present invention.

The wavelength-variable light source includes 3-dB directional coupler (hereinafter referred to as a 2×2 3-dB directional coupler) with two input paths and two output paths. The wavelength-variable light source also forms closed loop-type optical circuit 5 with two output path ends of 3-dB directional coupler 3 connected together.

In optical circuit 5, resonators 1 and 2 with slightly different resonance wavelength periods are cascaded together. One input path end 6 of 3-dB directional coupler 3 is connected to optical amplifier 4. Other input path end 7 of 3-dB directional coupler 3 includes a non-reflecting mechanism.

Light emitted by optical amplifier 4 in a stimulated manner is branched into two light waves by a branching section of 3-dB directional coupler 3. The light waves pass through resonators 1 and 2, respectively. The light waves reach 3-dB directional coupler 3 again and are then multiplexed. The resultant light returns to optical amplifier 4.

Furthermore, light waves not passing through resonators 1 and 2 return to 3-dB directional coupler 3 as reflected lights and are then multiplexed. The resultant light is emitted from one end 7 of optical circuit 5.

That is, only the wavelength light that can pass through both resonators 1 and 2 reciprocates between optical amplifier 4 and closed-loop optical circuit 5 and is thus amplified and oscillated as laser light.

Figure 2:
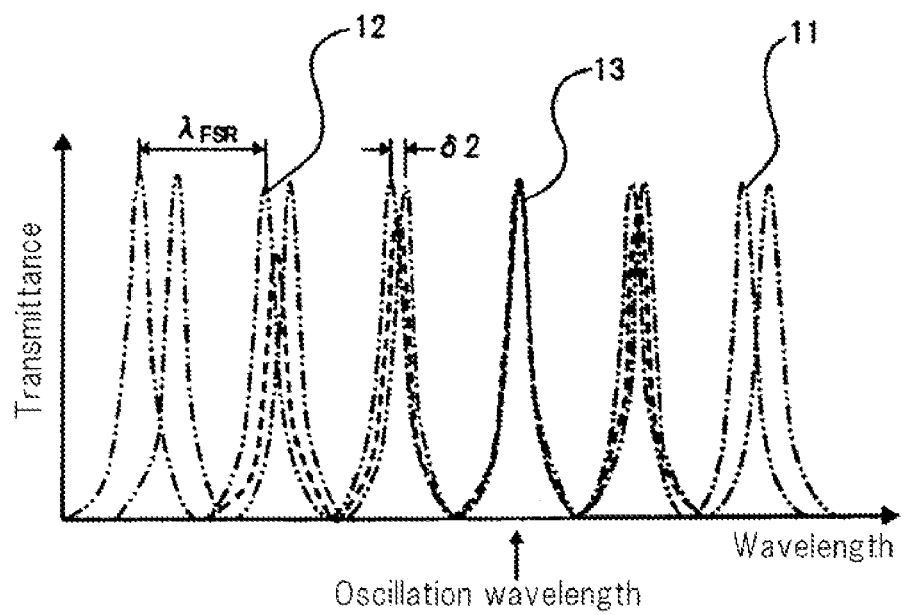
FIG. 2 is a schematic diagram showing a transmittance spectrum of a wavelength-variable resonator and illustrating the operation of the present invention.

FIG. 2 schematically shows a transmission spectrum corresponding to a wavelength spectrum obtained when a light wave received from optical amplifier 4 returns to optical amplifier 4 again. Transmission spectrum 13 shown in FIG. 2 is obtained by synthesizing transmission spectrum 11 of resonator 1 with transmission spectrum 12 of resonator 2. The transmitted light intensity in transmission spectrum 13 is highest at a wavelength at which transmission spectra 11 and 12 coincide with each other. Laser oscillation occurs at this wavelength.

When the resonance wavelength of resonator 1 is slightly varied by an appropriate means, transmission spectrum wavelength which coincides at two resonators can be shifted to an adjacent resonance spectrum peak. That is, according to this operation, it becomes possible to vary an oscillation wavelength.

Furthermore, when ratio of difference δλ between the resonance wavelength periods of the two resonators to resonance wavelength period $\lambda_{FSR}$ of resonator 1 is defined as M=$\lambda_{FSR}$/δλ, an oscillation wavelength interval that can be varied by varying the resonance wavelength of resonator 1 is defined as M×$\lambda_{FSR}$.

For example, if the resonance wavelength period of resonator 1 is set to 0.4 nm, which is equal to the channel interval of WDM optical communication, setting M=80 enables wavelength-variable oscillation that covers the entire C band (about 32 nm).

In the wavelength-variable light source according to the present invention, a waveguide etalon with an appropriate reflectance (transmittance) is applied to two end faces of each of resonators 1 and 2. This enables an easy increase not only in the value of M but also in resonance wavelength period $\lambda_{FSR}$. That is, reducing the length of the waveguide etalon enables an easy increase in resonance wavelength period $\lambda_{FSR}$.

First Exemplary Embodiment

Now, a first exemplary embodiment will be described with reference to the drawings.

Figure 3:
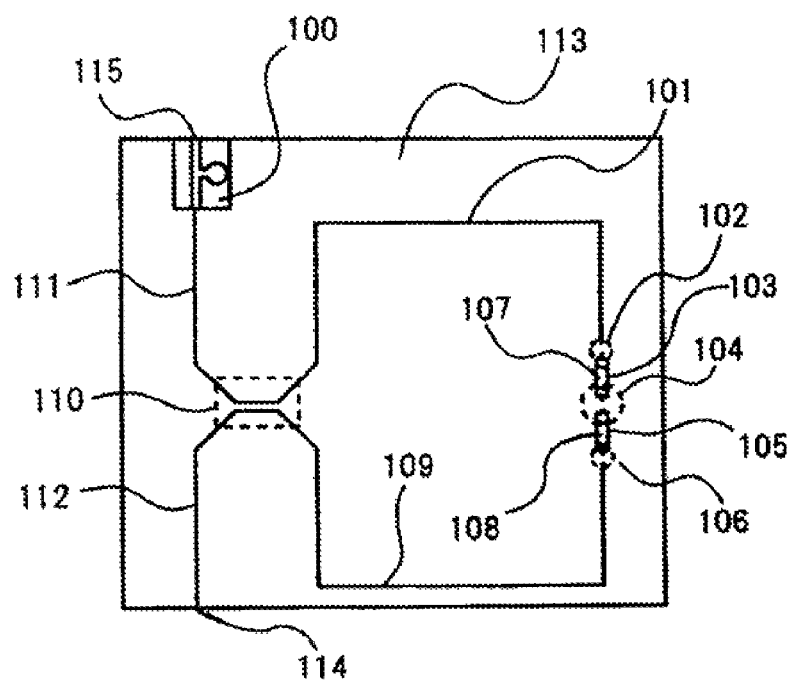
FIG. 3 is a schematic diagram schematically showing a wavelength-variable light source according to a first embodiment of the present invention.

FIG. 3 is a schematic diagram schematically showing a wavelength-variable light source according to the first exemplary embodiment. In FIG. 3, a planar optical circuit is formed on SOI (Silicon On Insulator) substrate 113; the planar optical circuit is formed of an optical waveguide including a core layer formed of Si (silicon) and a clad layer formed of SiO$_2$ (quartz), and functions as a wavelength-variable resonator.

The planar optical circuit is formed of I/O optical waveguides 111 and 112, 2×2 3-dB directional coupler 110, and a closed-loop optical circuit with output waveguides 101 and 109 of 3-dB directional coupler 110 connected together.

Air gap mirrors 102, 104, and 106 with periodic air gaps allowing waveguide etalons to be formed are formed in a part of the closed-loop optical circuit. That is, waveguide etalon 103 and waveguide etalon 105 are formed in the closed-loop optical circuit as striped resonators; waveguide etalon 103 includes end faces formed of air gap mirrors 102 and 104, and waveguide etalon 105 includes end faces formed of air gap mirrors 104 and 106.

Figure 4:
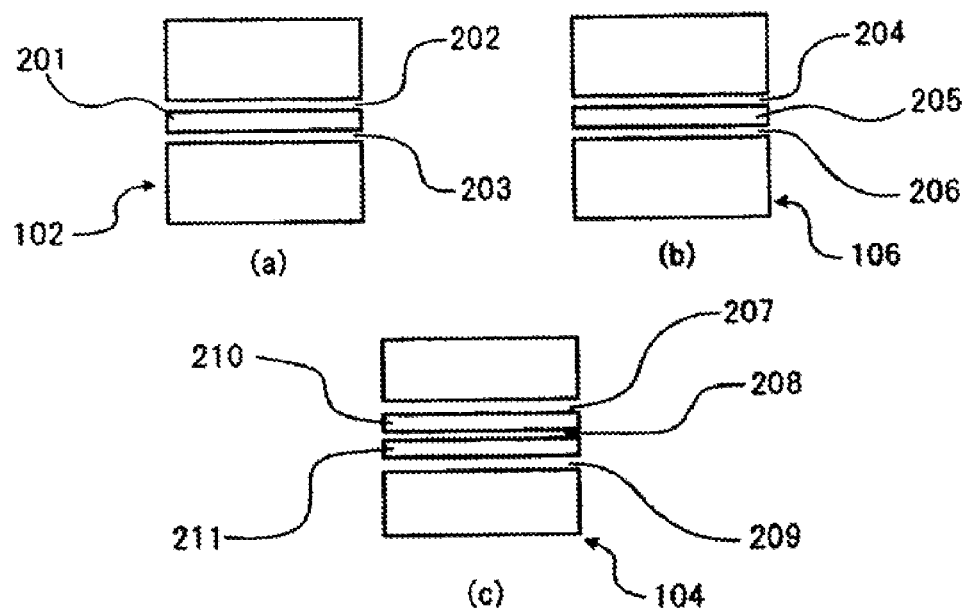
FIG. 4 is a schematic diagram showing the configuration of an air gap mirror in an Si waveguide.

FIGS. 4(a), 4(b), and 4(c) show the configurations of air gap mirrors 102, 106, and 104 respectively. Air gap mirrors 102, 106, and 104 include 150-nm air gaps 202, 203, 204, 206, 207, 209, and 210. Si optical waveguides 201, 205, 208, and 211 each with a length of 120 mm are formed between air gaps 202 and 203, between air gaps 204 and 206, between air gaps 207 and 209, and between air gaps 209 and 210, respectively.

Air gap mirrors 102 and 106 have the same structure. Air gap mirror 104 has one more frequency one period more than that of air gap mirrors 102 and 106.

Figure 5:
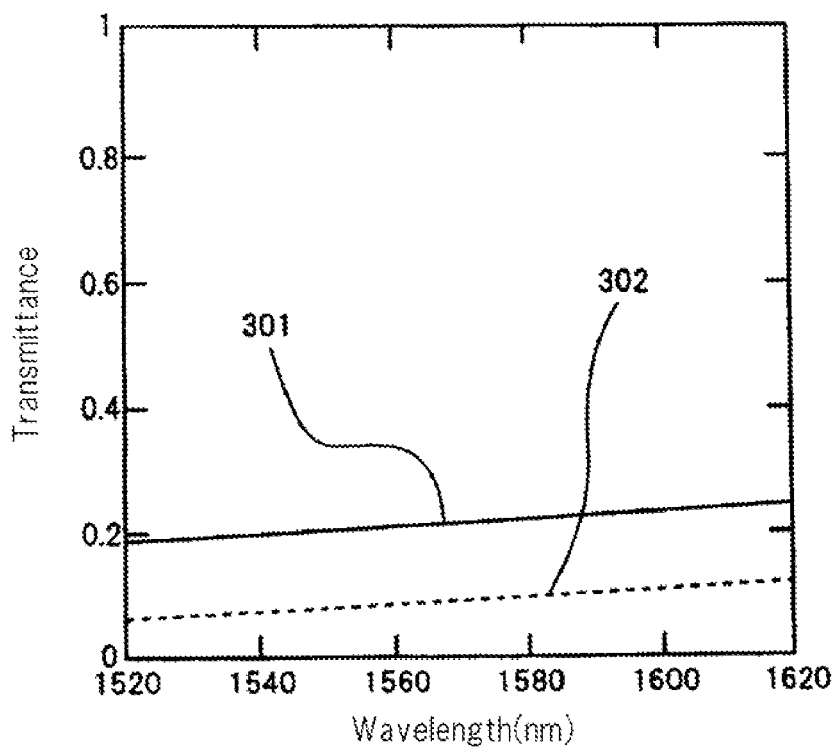
FIG. 5 is a schematic diagram showing the wavelength dependence of transmittance of the air gap mirror in the Si waveguide.

FIG. 5 shows the wavelength dependence of transmittance of the air gap mirrors. Reference numeral 301 in FIG. 5 denotes the transmittance of the air gap mirrors 102 and 106. Reference numeral 302 denotes the transmittance of air gap mirror 104. Both transmittances 301 and 302 of the air gap mirrors exhibit relatively uniform characteristics with respect to the wavelength.

With reference to FIG. 3, heaters 107 and 108 are formed in the upper parts of waveguide etalons 103 and 105 to shift the resonance peaks of the waveguide etalons using thermo-optic effects.

Moreover, one end of semiconductor optical amplifier 100 is coupled to an end face of I/O waveguide 111 in the planar optical circuit with low optical loss for hybrid integration. A dielectric film is added to other end face 115 of semiconductor optical amplifier 100 so as to provide a reflectance of about 10%.

Furthermore, non-reflecting coating is applied to end face 114 of I/O waveguide 112 in the planar optical circuit.

The operation of the laser light source according to the exemplary embodiment will be described in detail.

When current is injected into optical amplifier 100, part of excitation light is branched into two light waves by 3-dB directional coupler 110 via waveguide 111. The resultant light beams propagate through both waveguides 101 and 109. The light waves in waveguides 101 and 109 propagate through waveguide etalons 103 and 105 at transmittances corresponding to the respective wavelength components. After being guided though waveguides 101 and 109, the light waves are multiplexed in 3-dB directional coupler 110 again and then enter optical amplifier 100 via waveguide 111.

Wavelength light with the highest intensity among the wavelength components having passed through waveguide etalons 103 and 105 reciprocates between optical amplifier 100, waveguide 111, 3-dB directional coupler 110, and a composite resonator formed of waveguide etalons 103 and 105. The wavelength light is emitted from end face 115 through stimulated emission in optical amplifier 100, as laser light.

On the other hand, wavelength components reflected by waveguide etalons 103 and 105 without passing through waveguide etalons 103 and 105 travel through waveguides 101 and 109 in the opposite direction. The wavelength components are then multiplexed in 3-dB directional coupler 110. The multiplexed light waves propagate through waveguide 112 and are then emitted from end face 114.

Light reflected by the end face of the waveguide etalon passes through 3-dB directional coupler 110 and then propagates toward waveguide 112. This is because the length of waveguide 101 between 3-dB directional coupler 110 and air gap mirror 102 at the end face of the waveguide etalon is set equal to the length of waveguide 109 between 3-dB directional coupler 110 and air gap mirror 106 at the end face of the waveguide etalon.

Figure 6:
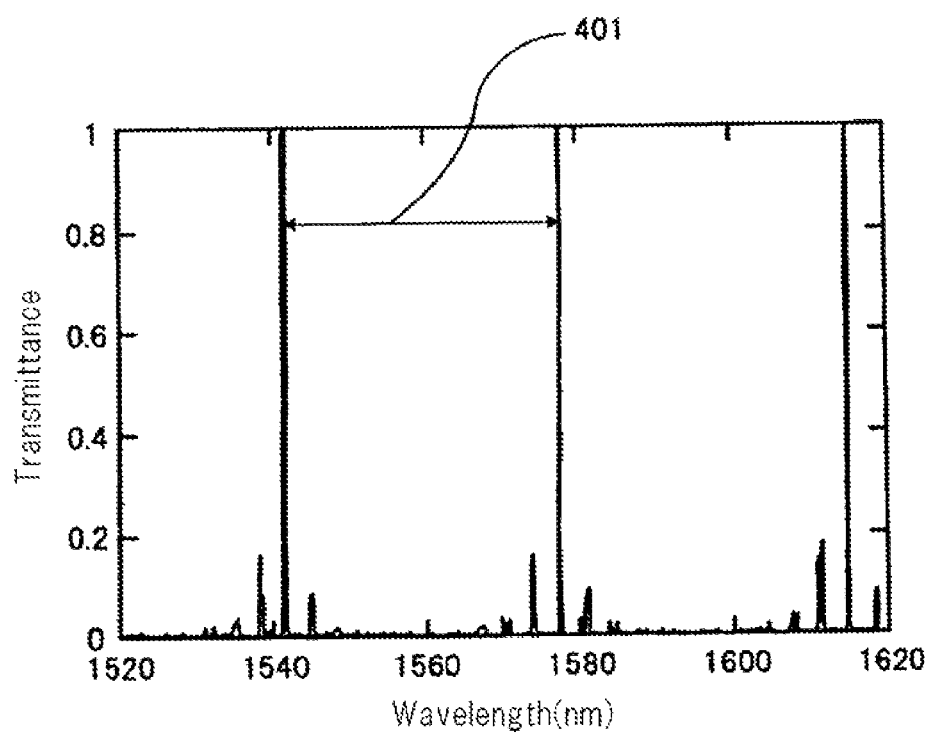
FIG. 6 is a schematic diagram showing the wavelength dependence of transmittance of the wavelength-variable resonator according to the present invention.

FIG. 6 shows the wavelength dependence of the rate of light intensity (transmittance) observed when a light wave having propagated through waveguide 111 is guided through the resonator and back to waveguide 111. FIG. 6 shows that the transmittance exhibits the highest peak at the wavelength component at which the resonance wavelengths of two waveguide etalons 103 and 105 are equal.

Furthermore, when heater 107 or 108 is used as a resonance wavelength variation element to increase the temperature of waveguide etalons 103 and 105, the resonance wavelengths of waveguide etalons 103 and 105 vary. This enables variation of the wavelength component at which the resonance wavelengths of two waveguide etalons 103 and 105 are equal.

Here, the waveguide-wise lengths of two waveguide etalons 103 and 105 are defined as $L_1$ and $L_2$, respectively. Then, a parameter M called a tuning multiplication coefficient is defined by the following expression (1):

$$M = 1/(1 - L_1/L_2) \quad (1)$$

Moreover, the resonance wavelength period of the waveguide etalon is defined as laser$_R$, and the wavelength-variable range of laser is defined as $\lambda_{tuning}$. Then, $\lambda_{tuning}$ is expressed by Expression (2) described below. Wavelength interval 401 of the peak transmittance in FIG. 6 is the wavelength-variable range.

$$\lambda_{tuning} = M \times \lambda_{FSR} \quad (2)$$

For example, when L1, L2, and $\lambda_{FSR}$ are set to 100 µm, 110 µm, and 3.2 nm, respectively, a configuration is obtained which provides a wavelength-variable interval of 35 nm that can cover the entire C band in WDM optical communication.

Furthermore, the wavelength-variable range can further be increased by appropriately adjusting $L_1$ and $L_2$ in Expression (1).

"Second Exemplary Embodiment"

Now, a second exemplary embodiment will be described.

Figure 7:
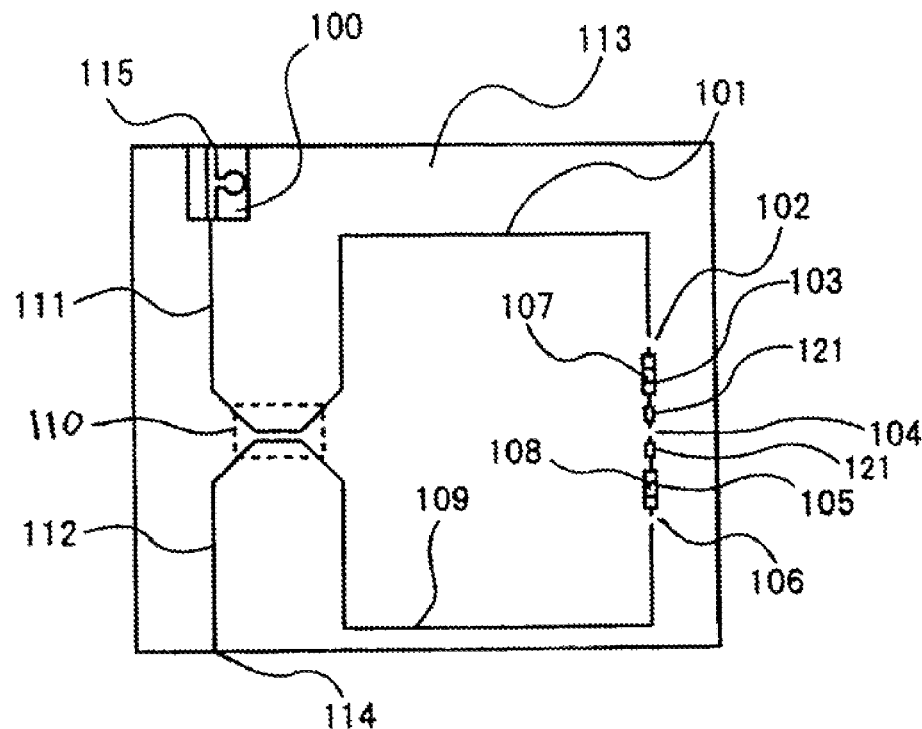
FIG. 7 is a schematic diagram showing a wavelength-variable light source according to a second embodiment of the present invention.

Here, a configuration is shown in which the thermal resistance between two waveguide etalons 103 and 105 is sufficiently increased to suppress the thermal crosstalk between waveguide etalons 103 and 105, particularly stabilizing wavelength control performed by heaters 107 and 108. FIG. 7 is a schematic diagram showing the second exemplary embodiment. The same components as those of the first exemplary embodiment are denoted by the same reference numerals.

As shown in FIG. 7, the second exemplary embodiment corresponds to the above-described first exemplary embodiment additionally including thermal separation waveguides 121. That is, two thermal separation waveguides (waveguides configured to suppress heat transfer) 121 are interposed between waveguide etalons 103 and 105 at the respective positions in order to reduce the thermal crosstalk between waveguide etalons 103 and 105 resulting from heat generated by heaters 107 and 108.

Figure 8:
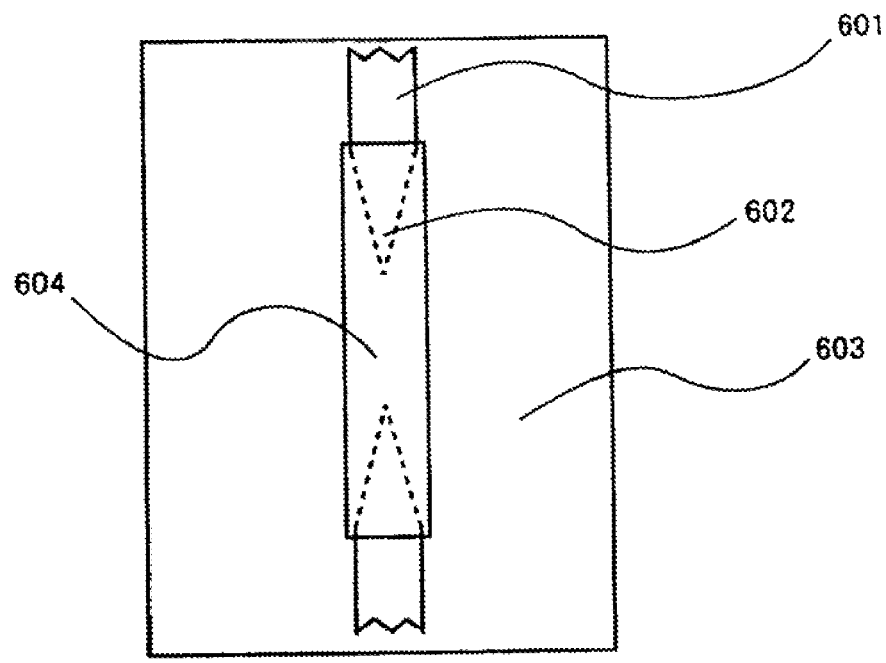
FIG. 8 is a schematic diagram showing the configuration of an optical waveguide with a thermal separation function.

FIG. 8 is a schematic diagram showing the structure of thermal separation waveguide 121. A tip portion of Si waveguide core layer 601 covered with SiO$_2$ clad layer 603 has a tapered shape 602. Such a shape allows the spot size of waveguide light to be gradually varied. Thus, Si waveguide core layer 601 and optical waveguide 604 with an SiON layer as a core layer can be coupled with low optical loss.

Furthermore, the thermal conductivity of SiON is about one-hundredths of that of Si. Thus, the heat transfer between waveguides can be suppressed by interposing an SiON waveguide between Si waveguides.

As described above, according to the second exemplary embodiment, the thermal crosstalk between two waveguide etalons 103 and 105 can be suppressed without an increase in light wave loss. Thus, wavelength-variable control can be stably and accurately performed.

(Other Exemplary Embodiments)

As described above, the wavelength-variable light source according to the present invention includes the closed-loop-type circuit, the composite resonator, and the optical amplifier.

The closed loop-type circuit is formed by connecting the two output path ends of the 2×2 3-dB directional coupler together. The composite resonator is formed by providing a part of the loop of the closed loop-type circuit with the at least two of the resonators having different resonance wavelength periods.

One input path end of the 3-dB directional coupler is optically connected to one end of the optical amplifier. The reflection structure with an appropriate reflectance is added to the other end of the optical amplifier. The non-reflecting structure is provided at the other input path end of the 3-dB directional coupler. Lasing light with a particular wavelength is output from the other end of the optical amplifier.

The resonance wavelength variation element configured to vary the resonance wavelength of the resonator is provided in at least one of the at least two resonators. This element varies the resonance wavelength of the resonator to allow the wavelength of output lasing light to be varied.

In a preferred aspect, the 3-dB directional coupler, the closed loop-type optical circuit, and the resonator are formed of an optical waveguide provided on the same substrate. That is, the 3-dB directional coupler, the closed loop-type optical circuit, and the resonator form a planar optical circuit. In this case, a semiconductor amplifier is hybrid-integrated on the substrate as the optical amplifier.

In this aspect, the optical waveguide may include a core layer formed of SiON and a clad layer formed of SiO$_2$.

Alternatively, the substrate may be an SOI (Silicon On Insulator) substrate, and the substrate may include a core layer of the optical guide formed of Si and a clad layer of the optical guide formed of SiO$_2$.

Alternatively, the substrate may be a compound semiconductor substrate which is composed of a compound semiconductor composition such that the core layer in the optical waveguide has a higher reflectance than the peripheral clad layer. In this case, the resonator and the semiconductor amplifier are monolithically integrated on the substrate.

Furthermore, in the above-described aspect, the resonator configuring a part of the closed loop-type optical circuit may be a waveguide type resonator with a predetermined transmittance at the opposite ends thereof. In this configuration, periodic air gaps (air gaps arranged at predetermined intervals) with a predetermined transmittance are formed in a part of the closed loop-type optical circuit. The periodic air gaps may be arranged at each of the opposite ends of the waveguide type resonator.

Additionally, the resonance wavelength variation element in the above-described aspect may be provided with a heater located near the resonator in order to increase the temperature of the resonator.

Alternatively, the above-described resonance wavelength variation element may include an electrode structure with an anode and a cathode in order to utilize an electrooptic effect resulting from application of a voltage to the core layer in the optical waveguide included in the resonator.

If at least a part of the clad in the optical waveguide included in the resonator is a dielectric film configured to exert an electrooptic effect, the resonance wavelength variation element may include an electrode structure for applying a voltage to the dielectric film.

Furthermore, an MMI (MultiMode Interference) coupler may be used as alternative means to the 3-dB directional coupler.

A first effect of the wavelength-variable light source according to the above-described aspect is such that the FSR (Free Spectrum Range, that is, resonance wavelength period) of the resonators included in the wavelength-variable resonator can be expanded more easily than resonators of different types. In addition, the wavelength-variable range of the wavelength-variable resonator as a whole can be increased.

For example, in a ring type resonator, the FSR is limited by the bending radius of the ring. In contrast, in the present invention, the resonators included in the wavelength-variable resonator may be striped resonators that enable the FSR to be increased simply by reducing the length of the resonators.

A second effect of the wavelength-variable light source according to the above-described aspect is such that a planar optical circuit is applicable as a component of the wavelength-variable resonator. Moreover, main elements of the planar optical circuit are air gaps (grating mirrors) required to form an etalon in the middle of the closed loop-like waveguide to the 3-dB directional coupler. Thus, the wavelength-variable light source according to the above-described aspect requires a reduced number of components and thus has a simple circuit configuration. This serves to reduce manufacture costs.

A third effect of the wavelength-variable light source according to the above-described aspect is such that the size of the resonators included in the wavelength-variable resonator can be reduced (the length of the striped resonators is reduced). This enables a reduction in the size of the wavelength-variable resonator as a whole. As a result, a small-sized wavelength-variable light source can be implemented.

A fourth effect of the wavelength-variable light source according to the above-described aspect is such that the wavelength-variable resonator and the semiconductor optical amplifier can be hybrid-integrated or monolithically integrated on the same semiconductor substrate. This enables a reduction in the number of components incorporated into a module. As a result, the costs can be reduced.

The present invention has been described in conjunction with the several embodiments. However, the present invention is not limited to these embodiments. Of course, various changes may be made to the embodiments without departing from the technical concepts of the present invention.

The invention claimed is:

1. A wavelength-variable light source configured to vary a wavelength of output lasing light, the wavelength-variable light source comprising:
   a 3-dB directional coupler including two input paths and two output paths;
   a closed loop-type optical circuit formed by connecting ends of the two output paths of the 3-dB directional coupler;
   at least two resonators cascaded together so as to form a part of the closed loop-type optical circuit and having different resonance wavelength periods;
   an optical amplifier including one end which is optically connected to one of the input path ends of the 3-dB directional coupler, and to another end from which the lasing light is output;
   a reflecting structure formed at the other end of the optical amplifier and having a predetermined reflection rate
   a non-reflecting structure formed at the other input path end of the 3-dB directional coupler; and
   a resonance wavelength variation element configured to vary the resonance wavelength of at least one of the at least two resonators.

2. The wavelength-variable light source according to claim 1, wherein the 3-dB directional coupler, the closed loop-type optical circuit, and the resonator are formed of an optical waveguide formed on the same substrate, and
   a semiconductor amplifier is hybrid-integrated on the substrate as the optical amplifier.

3. The wavelength-variable light source according to claim 2, wherein the optical waveguide includes a core layer formed of SiON and a clad layer formed of $SiO_2$.

4. The wavelength-variable light source according to claim 2, wherein the substrate is an SOI (Silicon On Insulator) substrate, and the optical substrate includes a core layer formed of Si and a clad layer formed of $SiO_2$.

5. The wavelength-variable light source according to claim 2, wherein the substrate is a compound semiconductor substrate, which is composed of a compound semiconductor composition such that the core layer in the optical waveguide has a higher reflectance than the peripheral clad layer.

6. The wavelength-variable light source according to claim 5, wherein the resonator and the semiconductor amplifier are monolithically integrated on the substrate.

7. The wavelength-variable light source according to claim 1, wherein the resonator configuring a part of the closed loop-type optical circuit is a waveguide type resonator with a predetermined transmittance at the opposite ends thereof.

8. The wavelength-variable light source according to claim 7, wherein periodic air gaps with a predetermined transmittance are formed in a part of the closed loop-type optical circuit, and the periodic air gaps are arranged at each of the opposite ends of the waveguide type resonator.

9. The wavelength-variable light source according to claim 1, wherein the resonance wavelength variation element is provided with a heater located near the resonator in order to increase the temperature of the resonator.

10. The wavelength-variable light source according to claim 4, wherein the resonance wavelength variation element includes an electrode structure with an anode and a cathode in order to utilize an electrooptic effect resulting from application of a voltage to the core layer in the optical waveguide included in the resonator.

11. The wavelength-variable light source according to claim 4, wherein at least a part of the clad in the optical waveguide included in the resonator is a dielectric film configured to exert an electrooptic effect, and the resonance wavelength variation element includes an electrode structure for applying a voltage to the dielectric film.

12. The wavelength-variable light source according to claim 1, wherein an MMI (MultiMode Interference) coupler is used as an alternative means to the 3-dB directional coupler.

* * * * *